(12) United States Patent
Tao et al.

(10) Patent No.: US 12,191,195 B2
(45) Date of Patent: Jan. 7, 2025

(54) METHOD OF FABRICATING AN AIR GAP

(71) Applicant: UNITED MICROELECTRONICS CORP., Hsin-Chu (TW)

(72) Inventors: Bo Tao, Singapore (SG); Runshun Wang, Singapore (SG); Li Wang, Singapore (SG); Ching-Yang Wen, Pingtung County (TW); Purakh Raj Verma, Singapore (SG); Dong Yin, Nantong (CN); Jian Xie, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 560 days.

(21) Appl. No.: 17/409,756

(22) Filed: Aug. 23, 2021

(65) Prior Publication Data
US 2023/0058468 A1 Feb. 23, 2023

(51) Int. Cl.
*H01L 21/768* (2006.01)

(52) U.S. Cl.
CPC .... *H01L 21/7682* (2013.01); *H01L 21/76802* (2013.01)

(58) Field of Classification Search
CPC ........................ H01L 21/7682; H01L 21/76802
See application file for complete search history.

(56) References Cited

U.S. PATENT DOCUMENTS

| | | | |
|---|---|---|---|
| 8,232,618 B2 | 7/2012 | Breyta | |
| 8,293,617 B2 | 10/2012 | McGinnis | |
| 8,456,009 B2 | 6/2013 | Su | |
| 9,166,012 B2 | 10/2015 | Sim | |
| 9,401,371 B1 | 7/2016 | Lee | |
| 9,514,980 B2 | 12/2016 | Lee | |
| 9,991,179 B2 | 6/2018 | Ohashi | |
| 10,707,120 B1 * | 7/2020 | Yami | H01L 21/76224 |
| 2003/0230551 A1 * | 12/2003 | Kagoshima | H01L 21/32137 216/60 |
| 2006/0015206 A1 * | 1/2006 | Funk | H01L 21/67253 700/121 |
| 2017/0330790 A1 * | 11/2017 | He | H01L 21/76805 |
| 2021/0175166 A1 * | 6/2021 | McGahay | H01L 23/53295 |
| 2021/0327813 A1 * | 10/2021 | Singh | H01L 21/76802 |

FOREIGN PATENT DOCUMENTS

CN 113053884 A * 6/2021 ........... H01L 21/743

* cited by examiner

*Primary Examiner* — Ratisha Mehta
*Assistant Examiner* — Brad A Knudson
(74) *Attorney, Agent, or Firm* — Winston Hsu

(57) ABSTRACT

A method of fabricating an air gap includes receiving a first thickness information of an inter-metal dielectric layer formed on a substrate and receiving a second thickness information of an inter-layer dielectric layer formed on the substrate. Then, a first etching is performed, wherein the first etching includes etch the inter-metal dielectric layer based on a first etching control value corresponding to the first thickness information. After the first etching, a second etching is performed to etch the inter-layer dielectric layer based on a second etching control value corresponding to the second thickness information.

18 Claims, 5 Drawing Sheets

METHOD OF FABRICATING AN AIR GAP

BACKGROUND OF THE INVENTION

1. Field of the Invention

The present invention relates to method of forming an air gap within inter-metal dielectric layers, and more particularity to a method including adjusting the etching time of an inter-metal dielectric layers based on the thickness of the inter-metal dielectric layers.

2. Description of the Prior Art

As the size of semiconductor devices continues to decrease in order to improve the degree of integration, a resistor-capacitor (RC) delay related to wires of a circuit becomes a limiting factor affecting the speed of semiconductor devices.

Therefore, it becomes increasingly important to implement low dielectric constant (k) schemes between tightly spaced metal lines. Reducing the capacitance between the interconnect metal lines on an integrated circuit chip will enhance the speed of the device and reduce extraneous signal energy (cross-talk) from traversing from one metal line to another.

SUMMARY OF THE INVENTION

In light of above, the present invention provides a method of fabricating an air gap within the inter-metal dielectric layer to reduce the dielectric constant.

According to a preferred embodiment of the present invention, a method of fabricating an air gap includes providing a substrate, wherein a semiconductor device is disposed on the substrate, a stress layer contacts the semiconductor device, an inter-layer dielectric layer is disposed on and contacts the stress layer, an etching stop layer is disposed on the and contacts the inter-layer dielectric layer, an inter-metal dielectric layer is disposed on and contacts the etching stop layer, a first metal interconnection and a second metal interconnection are respectively disposed within the inter-metal dielectric layer at two sides of the semiconductor device. Next, a first etching is performed to etch the inter-metal dielectric layer and the etching stop layer between the first metal interconnection and the second metal interconnection and directly on the semiconductor device. Then, a second etching is performed to etch the inter-layer dielectric layer without etching the stress layer to form a trench within the inter-metal dielectric layer, the etching stop layer and the inter-layer dielectric layer. Finally, an insulating layer is formed to seal the trench to form the air gap.

According to another preferred embodiment of the present invention, a method of fabricating an air gap includes receiving a first thickness information of an inter-metal dielectric layer formed on a substrate and receiving a second thickness information of an inter-layer dielectric layer formed on the substrate. Then, a first etching is performed, wherein the first etching includes etch the inter-metal dielectric layer based on a first etching control value corresponding to the first thickness information. After the first etching, a second etching is performed to etch the inter-layer dielectric layer based on a second etching control value corresponding to the second thickness information.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a method of fabricating an air gap according to a preferred embodiment of the present invention, wherein:

FIG. 1 depicts a substrate with a semiconductor device and several dielectric layers;

FIG. 2 depicts a fabricating stage following FIG. 1;

FIG. 3 depicts a fabricating stage following FIG. 2;

FIG. 4 depicts a fabricating stage following FIG. 3; and

FIG. 5 depicts a fabricating stage following FIG. 4.

DETAILED DESCRIPTION

Figure 7:
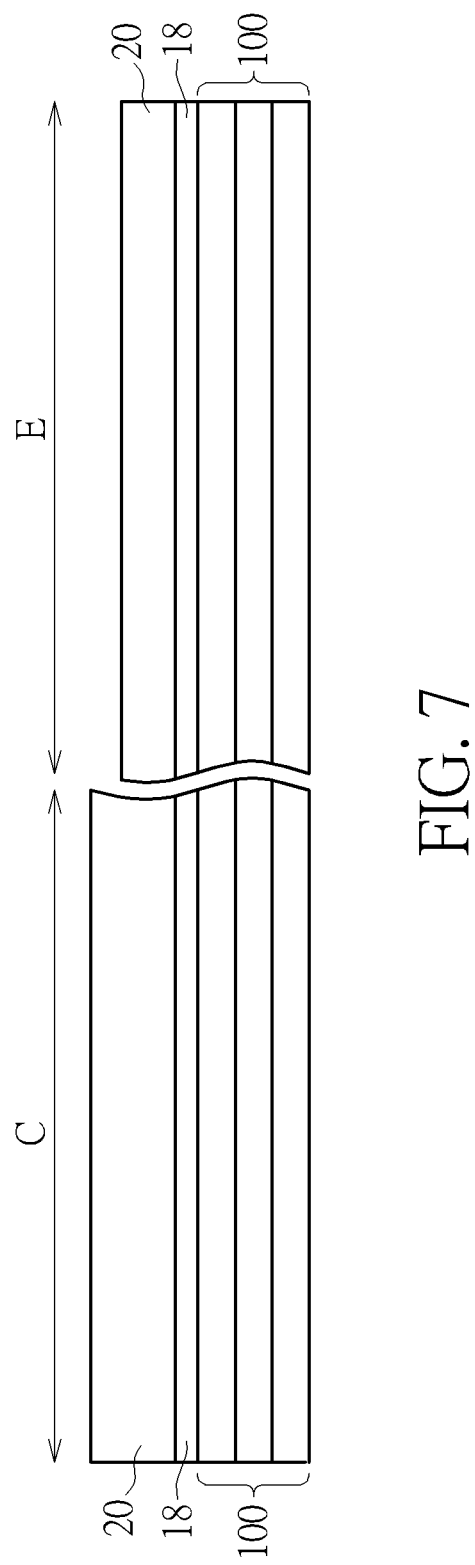
FIG. 7 depicts a center portion and an edge portion on a blanket wafer.
Figure 8:
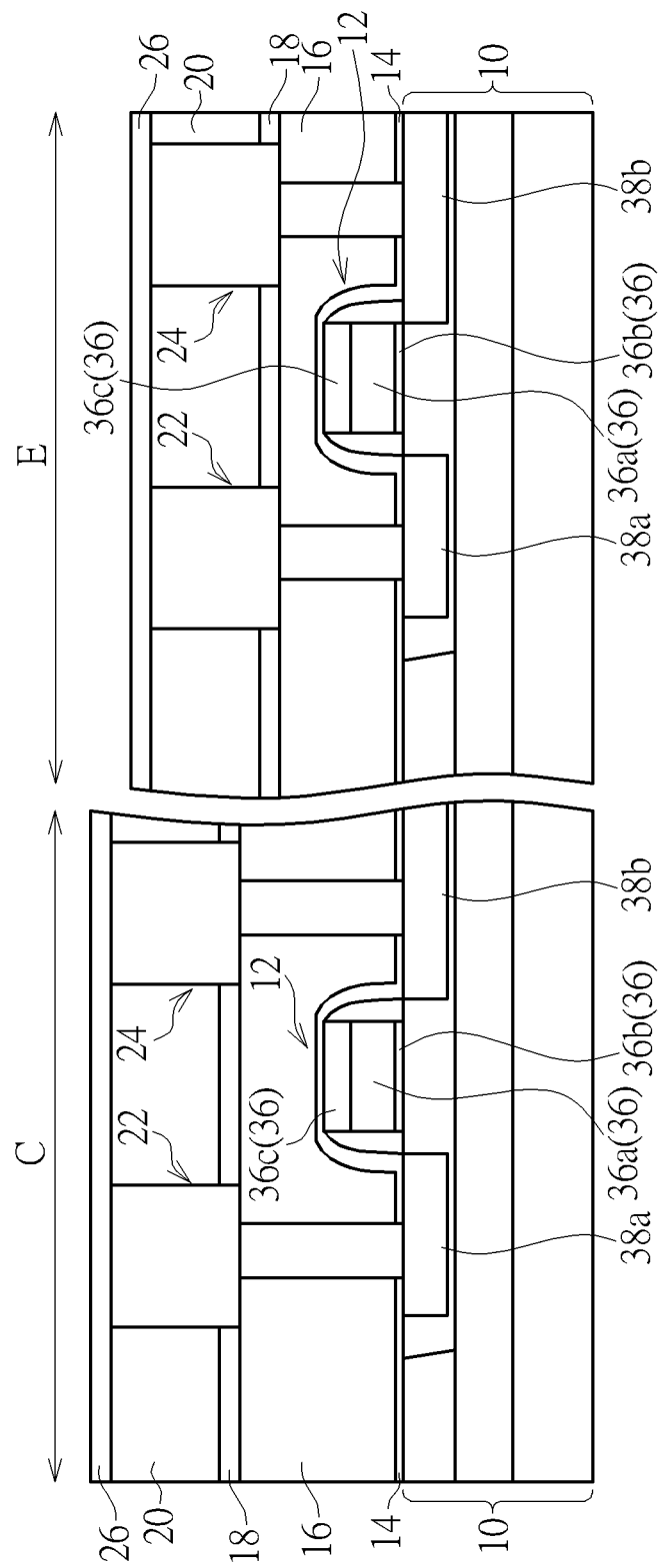
FIG. 8 depicts a center portion and an edge portion on a substrate.

FIG. 1 to FIG. 5 depict a method of fabricating an air gap according to a preferred embodiment of the present invention. FIG. 7 depicts a center portion and an edge portion on a blanket wafer. FIG. 8 depicts a center portion and an edge portion on a substrate. Elements in FIG. 7 and FIG. 8 which substantially the same as the elements in FIGS. 1 to 5 are denoted by the same reference numerals; an accompanying explanation is therefore omitted.

Figure 1:
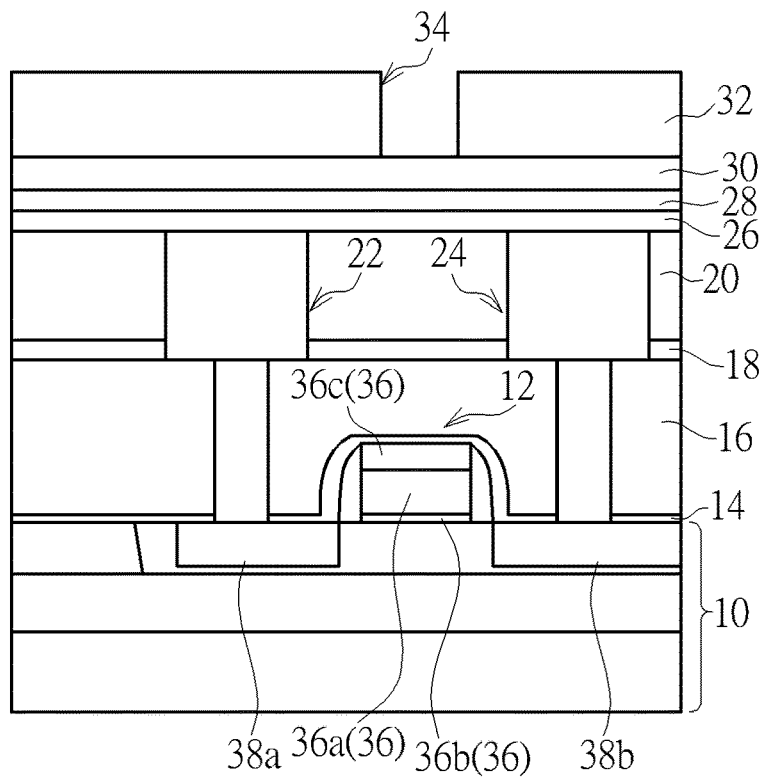

As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A semiconductor device 12 is disposed on the substrate 10, a stress layer 14 contacts the semiconductor device 12, an inter-layer dielectric layer 16 is disposed on and contacts the stress layer 14, an etching stop layer 18 is disposed on the and contacts the inter-layer dielectric layer 16, an inter-metal dielectric layer 20 is disposed on and contacts the etching stop layer 18, a first metal interconnection 22 and a second metal interconnection 24 are respectively disposed within the inter-metal dielectric layer 20 at two sides of the semiconductor device 12. An etching stop layer 26 is disposed on and contacts the inter-metal dielectric layer 20. A dielectric anti-reflective coating (DARC) 28 is disposed on and contacts the etching stop layer 26. A bottom anti-reflection coating (BARC) 30 is disposed on and contacts the DARC 28. A photoresist 32 covers the BARC 30. A pattern 34 of an air gap is arranged within the photoresist 32. In this embodiment, the semiconductor device 10 is a transistor including a gate structure 36, a source 38a and a drain 38b. The source 38a and the drain 38b are respectively embedded within the substrate 10 at two sides of the gate structure 36. The gate structure 36 includes a gate electrode 36a and a gate insulating layer 36b disposed between the gate electrode 36a and the substrate 10. The gate structure 36 may further include a cap layer 36c covering the gate electrode 36a.

Figure 2:
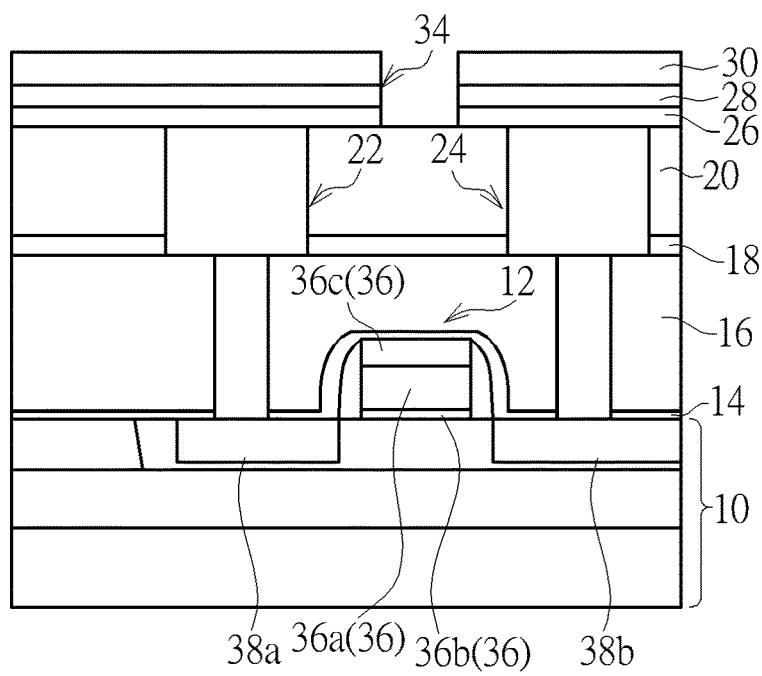

As shown in FIG. 2, the BARC 30, the DARC 28 and the etching stop layer 26 are etched by taking the photoresist 32 as a mask. Then the photoresist 32 is removed. Now the pattern 34 of the air gap is transferred into the BARC 30, the DARC 28 and the etching stop layer 26.

Figure 3:
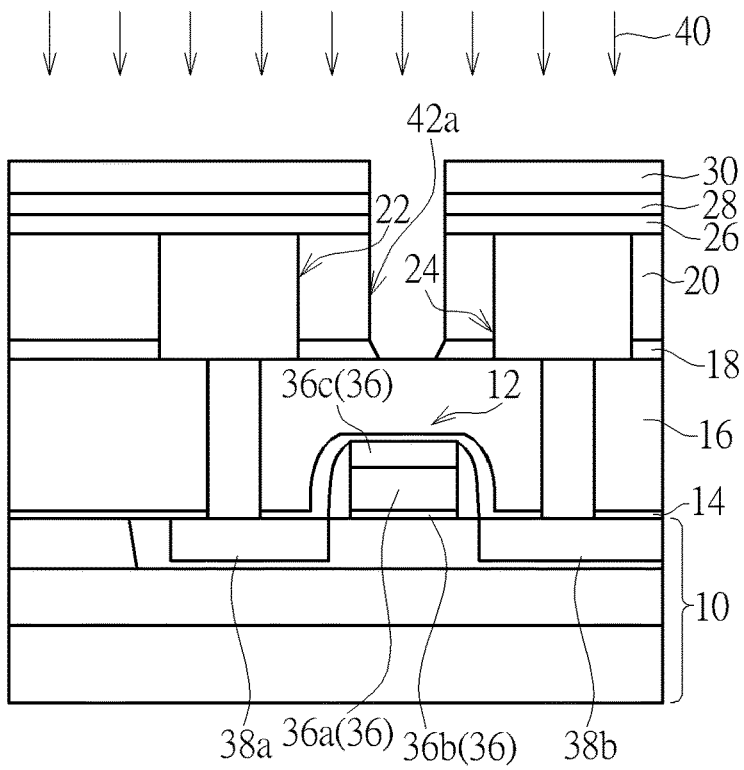

As shown in FIG. 3, FIG. 7 and FIG. 8, a first thickness information of an inter-metal dielectric layer 20 is provided. The first thickness information includes an average of thicknesses of the inter-metal dielectric layer at a center portion C and at an edge portion E of the substrate 10. A predetermined thickness of the inter-metal dielectric layer 20 is also provided. The predetermined thickness is decided by measuring an average of thicknesses of the inter-metal dielectric layer 20 at a center portion C and at an edge portion E on a blanket wafer 100. The blanket wafer 100 refers to a wafer which is covered by the inter-metal dielectric layer 20 and the etching stop layer 18 without patterns thereon. A predetermined etching time is a time to penetrate both of the inter-metal dielectric layer 20 and the etching stop layer 18 by an etching process performed to the blanket wafer 100. The operational parameters of a deposition process for forming the inter-metal dielectric layer 20 and the etching stop layer 18 on the blanket wafer 100 are set to form the inter-metal dielectric layer 20 and the etching stop layer 18 respectively with target thicknesses according to the product design.

However, please see FIG. 8, when the deposition process is carried out with the same operational parameters to the substrate 10, because there are semiconductor devices 12 disposed on the substrate 10, the average of thicknesses of the inter-metal dielectric layer 20 on the substrate 10 may differ from the average of thicknesses of the inter-metal dielectric layer 20 the blanket wafer 100. In this way, the etching time of etching through the inter-metal dielectric layer 20 and the etching stop layer 18 on the substrate 10, and the etching time of etching through the inter-metal dielectric layer 20 and the etching stop layer 18 on the blanket wafer 100 may be different. Because the etching stop layer 18 is thin, the thickness of the etching stop layer 18 on the substrate 10 and the thickness of the etching stop layer 18 on the blanket wafer 100 can be taken as the same, the etching time is primarily influenced by the thickness of the inter-metal dielectric layer 20.

In order to form air gaps with uniformed depths, the etching time of the inter-metal dielectric layer 20 and the etching stop layer 18 on the substrate 10 need to be adjusted. The following description related FIG. 3 illustrates how to adjust the etching time.

Please still refer to FIG. 3 and FIG. 8, a first etching 40 is performed. The first etching 40 includes etching the inter-metal dielectric layer 20 and the etching stop layer 18 on the substrate 10 based on a first etching control value corresponding to the first thickness information. The first etching control value includes a first operational etching time and the first operational etching time is set to etch through (penetrate) both of the inter-metal dielectric layer 20 and the etching stop layer 18 on the substrate 10. In details, the first etching is 40 performed to etch through the inter-metal dielectric layer 20 and the etching stop layer 18 between the first metal interconnection 22 and the second metal interconnection 24 and directly on the semiconductor device 10. After the first etching 40, the inter-metal dielectric layer 20 and the etching stop layer 18 are penetrated to form a trench 42a.

According to a preferred embodiment of the present invention, the first operational etching time is decided in accordance with the following rule A, rule B or rule C:

Rule A: if (predetermined thickness−thickness)÷predetermined thickness>D %, then first operational etching time<predetermined etching time;

Rule B: if (thickness−predetermined thickness)÷predetermined thickness>D %, then first operational etching time>predetermined etching time;

Rule C: if 0≤absolute value of (thickness−predetermined thickness)≤D %, then first operational etching time=predetermined etching time.

In this embodiment, D is 5. However, based on different product designs, D can be adjusted to any positive values. The term "thickness" in rules A, B and C refers to an average of thicknesses of the inter-metal dielectric layer 20 at the center portion C and at the edge portion E of the substrate 10 measured before the first etching 40. Furthermore, when the first operational etching time is decided by rule A, and the first etching 40 has an etching rate, then the first operational etching time=predetermined etching time−{[(100%−D %)×predetermined thickness−thickness]÷etching rate}. In other case, when the first operational etching time is decided by rule B, and the first etching 40 has an etching rate, then the first operational etching time={[thickness−(100%+D %)×predetermined thickness]÷etching rate}+predetermined etching time.

An example of the first etching 40 is provided as follows. The first etching 40 is performed by using $CF_4/CHF_3$ as etchant gas. The flow rate of $CF_4$ is 120 sccm. The flow rate of $CHF_3$ is 350 sccm. The operational temperature is 40 degree Celsius. The etching rate of the first etching 40 is 25 angstroms/second. Furthermore, in this example, the predetermined thickness is set to be 2000 angstroms. The predetermined etching time is set to be 50 seconds. D is 5. When the average of thicknesses of the inter-metal dielectric layer 20 at the center portion C and at the edge portion E of the substrate 10 is 1800 angstroms, in this case, the first operational etching time of the first etching 40 should follow rule A. That is, the first operational etching time is smaller than 50 seconds. In details, the first operational etching time=50−{[(100%−5%)×2000−1800]÷25}. Therefore, the operational etching time is 46 seconds.

If the average of thicknesses of the inter-metal dielectric layer 20 at the center portion C and at the edge portion E of the substrate 10 is 2200 angstroms, in this case, the first operational etching time of the first etching 40 should follow rule C. That is, the first operational etching time is greater than 50 seconds. In details, the first operational etching time={[2200−(100%+5%)×2000]÷25}+50. Therefore, the first operational etching time is 54 seconds. If the average of thicknesses of the inter-metal dielectric layer 20 at the center portion C and at the edge portion E of the substrate 10 between 1900 and 2100 angstroms, the operational etching time is 50 seconds.

Figure 4:
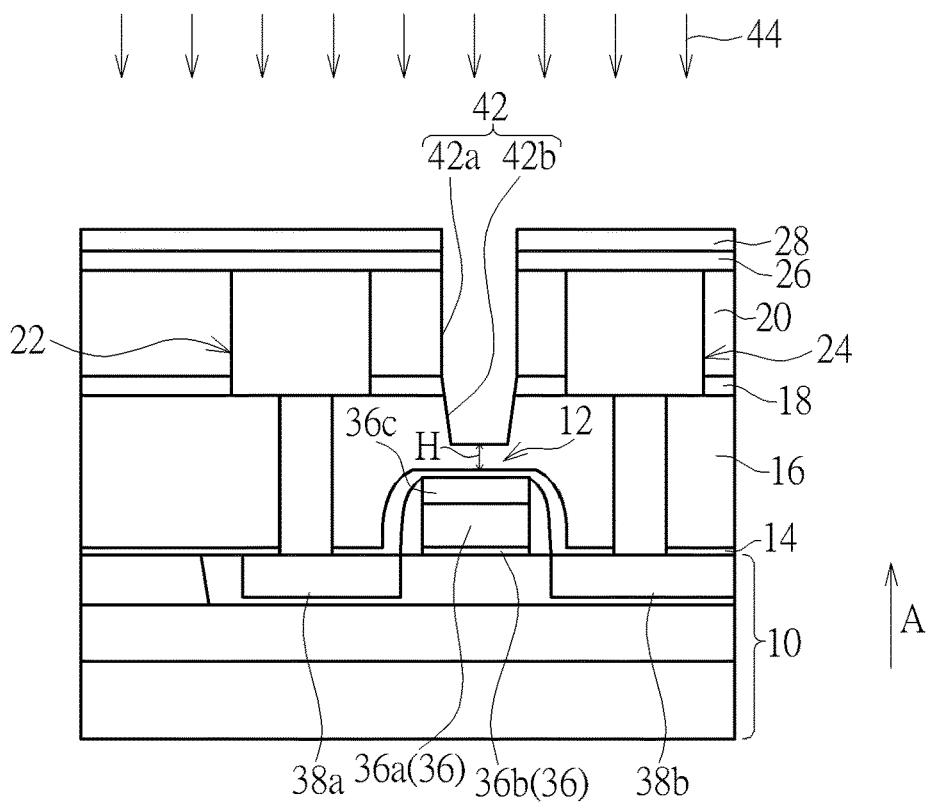

As shown in FIG. 4, after the first etching 40, the BRAC 30 is used up, and a second etching 44 is performed to etch the inter-layer dielectric layer 16 based on a second etching control value corresponding to the second thickness information. The second etching control value includes a second operational etching time and the second operational etching time is set such that the inter-layer dielectric layer 16 is etched to form a trench 42b which does not penetrate the inter-layer dielectric layer 16. The second thickness information includes an average of thicknesses of the inter-layer dielectric layer 16 at the center portion C and at the edge portion E of the substrate 10 measured before the second etching 44 is performed. In detail, second etching 44 is to etch the inter-layer dielectric layer 16 without etching the stress layer 14 to form the trench 42b. The trench 42a and the trench 42b are connected to each other and form a trench 42. The trench 42 is within the inter-metal dielectric layer 20, the etching stop layer 18 and the inter-layer dielectric layer 16. According to a preferred embodiment of the present invention, a distance H is disposed between a bottom of the trench 42 and the stress layer 14 along a direction A perpendicular to a top surface of the substrate 10, and the distance H is larger than or equal to 200 angstroms. According to a preferred embodiment of the present invention, the second etching 44 is performed by using $CF_4$ as etchant gas. The flow rate of $CF_4$ is 150 sccm. The operational temperature is 40 degree Celsius. The etching rate of the second etching 44 is 30 angstroms/second.

Figure 5:
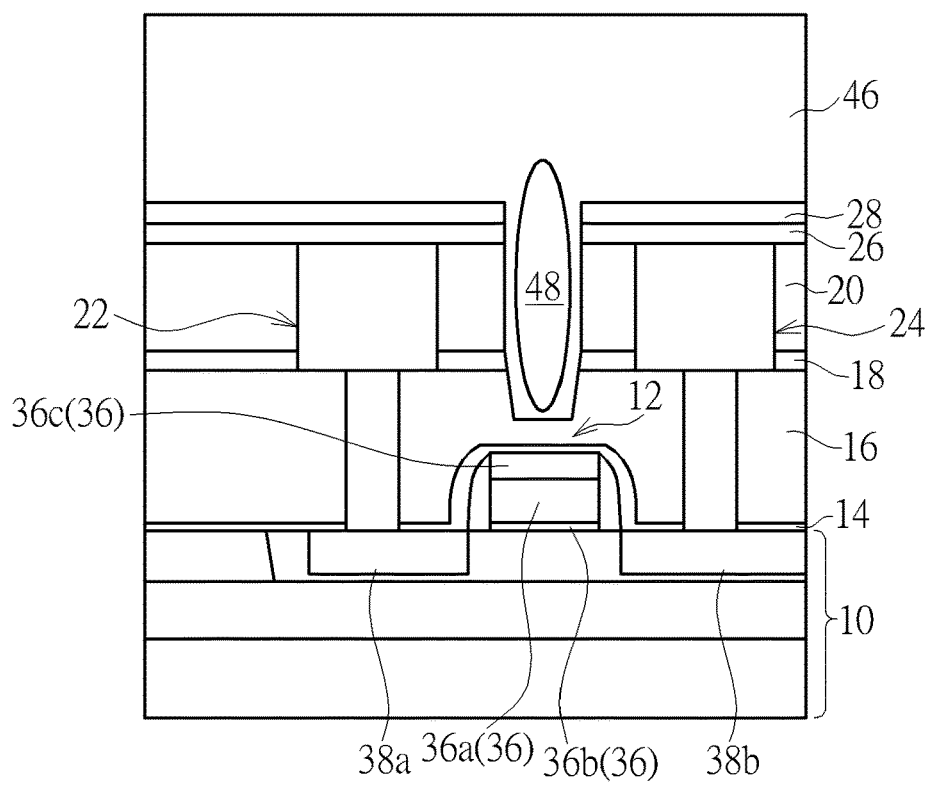

As shown in FIG. 4 and FIG. 5, an insulating layer 46 is formed to seal the trench 42 to form the air gap 48. The insulating layer 46 preferably serves as another inter-metal dielectric layer. Now the method of fabricating an air gap of the present invention is completed.

According to a preferred embodiment of the present invention, the stress layer 14 may be silicon nitride. The inter-layer dielectric layer 16 includes silicon oxide and the thickness of the inter-layer dielectric layer 16 is between 360 and 440 angstroms. The etching stop layer 18 includes silicon oxynitride and the thickness of the etching stop layer 18 is between 2150 and 3150 angstroms. The inter-metal dielectric layer 20 includes fluorinated silicon glass (FSG), and the thickness of the inter-metal dielectric layer 20 is between 1150 and 2750 angstroms. The etching stop layer 26 includes silicon nitride, and the thickness of the etching stop layer 26 is between 360 and 440 angstroms. The DARC 28 includes silicon oxynitride and the thickness of the DARC 28 is between 270 and 330 angstroms. The insulating layer 46 includes FSG.

Figure 6:
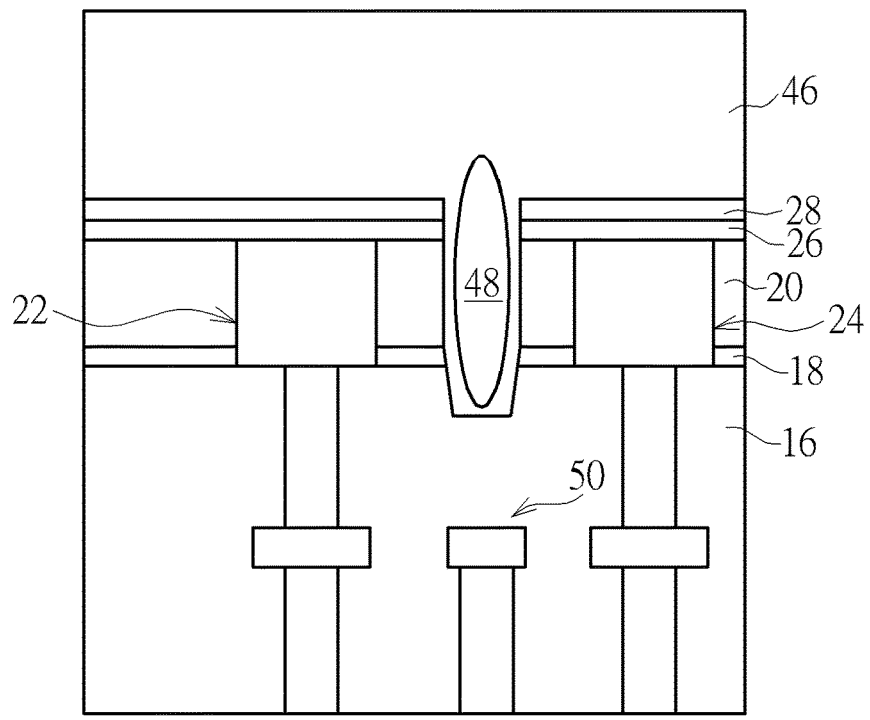
FIG. 6 depicts an air gap formed between metal interconnections.

FIG. 6 depicts an air gap formed between metal interconnections, wherein elements which substantially the same as the elements in FIG. 5 are denoted by the same reference numerals; an accompanying explanation is therefore omitted. As shown in FIG. 6, the air gap 48 can be formed between metal interconnections 22/24/50, and there can be no transistor around the air gap 48.

When an air gap is disposed above a gate structure, and between the metal interconnections, the parasitic capacitance between the gate structure and the metal interconnections can be reduced. However, because the thickness of the inter-metal dielectric layer differs between individual substrate, if the etch of the inter-metal dielectric layer is preformed based on the thickness of the inter-metal dielectric layer on a blanket wafer, the trench may become too deep or too shallow. If the trench becomes too deep to damage the stress layer, the efficiency of the transistor is deteriorated. Therefore, the present invention provides a method including etching the inter-metal dielectric layer based on the thickness of the inter-metal dielectric layer on respective substrate to make sure the trench is formed at a suitable depth.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an air gap, comprising:
providing a substrate, wherein a semiconductor device is disposed on the substrate, a stress layer contacts the semiconductor device, an inter-layer dielectric layer is disposed on and contacts the stress layer, an etching stop layer is disposed on and contacts the inter-layer dielectric layer, an inter-metal dielectric layer is disposed on and contacts the etching stop layer, a first metal interconnection and a second metal interconnection are respectively disposed within the inter-metal dielectric layer at two sides of the semiconductor device;
performing a first etching to etch the inter-metal dielectric layer and the etching stop layer between the first metal interconnection and the second metal interconnection and directly on the semiconductor device to form a first trench;
performing a second etching to form a second trench by etching the inter-layer dielectric layer without etching the stress layer and without widening the first trench, wherein the first trench and the second trench form a trench within the inter-metal dielectric layer, the etching stop layer and the inter-layer dielectric layer, and wherein a widest width of the second trench is not greater than a widest width of the first trench; and
forming an insulating layer to seal the trench to form the air gap.

2. The method of fabricating an air gap of claim 1, wherein a distance is disposed between a bottom of the trench and the stress layer along a direction perpendicular to a top surface of the substrate, and the distance is larger than or equal to 200 angstroms.

3. The method of fabricating an air gap of claim 1, wherein a predetermined thickness is designated to the inter-metal dielectric layer, a predetermined etching time is designated to the first etching, the inter-metal dielectric layer has a thickness which is acknowledged by measuring the inter-metal dielectric layer before the first etching, and the first etching is performed under an operational etching time which is decided in accordance with the following rule A, rule B or rule C:

Rule A: if (predetermined thickness−thickness)÷predetermined thickness>D %, then operational etching time<predetermined etching time;

Rule B: if (thickness−predetermined thickness)÷predetermined thickness>D %, then operational etching time>predetermined etching time;

Rule C: if 0≤absolute value of (thickness−predetermined thickness)≤D %, then operational etching time=predetermined etching time, wherein D is a positive number.

4. The method of fabricating an air gap of claim 3, wherein D is 5.

5. The method of fabricating an air gap of claim 3, wherein when the operational etching time is decided by rule A, and the first etching has an etching rate, then operational etching time=predetermined etching time−{[(100%−D %)×predetermined thickness−thickness]÷etching rate}.

6. The method of fabricating an air gap of claim 3, wherein when the operational etching time is decided by rule B, and the first etching has an etching rate, then operational etching time={[(thickness−(100%+D %)×predetermined thickness)]÷etching rate}+predetermined etching time.

7. The method of fabricating an air gap of claim 1, wherein the semiconductor device is a transistor comprising a gate structure, a source and a drain, the source and the drain are respectively embedded within the substrate at two sides of the gate structure.

8. The method of fabricating an air gap of claim 7, wherein the first metal interconnection contacts the source, the second metal interconnection contacts the drain, and the air gap is disposed directly on the gate structure and between the first metal interconnection and the second metal interconnection.

9. A method of fabricating an air gap, comprising:
receiving a first thickness information of an inter-metal dielectric layer formed on a substrate and receiving a second thickness information of an inter-layer dielectric layer formed on the substrate;
performing a first etching including etching the inter-metal dielectric layer based on a first etching control value corresponding to the first thickness information to form a first trench; and
after the first etching, performing a second etching to form a second trench by etching the inter-layer dielectric layer without widening the first trench based on a second etching control value corresponding to the second thickness information, and wherein a widest width of the second trench is not greater than a widest width of the first trench.

10. The method of fabricating an air gap of claim 9, wherein the first etching control value includes a first operational etching time and the first operational etching time is set to etch through the inter-metal dielectric layer and an etching stop layer.

11. The method of fabricating an air gap of claim 10, wherein a semiconductor device is disposed on the substrate, a stress layer contacts the semiconductor device, the inter-layer dielectric layer is disposed on and contacts the stress layer, the etching stop layer is disposed on and contacts the inter-layer dielectric layer, the inter-metal dielectric layer is disposed on and contacts the etching stop layer, a first metal interconnection and a second metal interconnection are respectively disposed within the inter-metal dielectric layer at two sides of the semiconductor device.

12. The method of fabricating an air gap of claim 11, wherein the first etching includes etching the inter-metal dielectric layer and the etching stop layer between the first metal interconnection and the second metal interconnection and directly on the semiconductor device.

13. The method of fabricating an air gap of claim 12, wherein a second etching is to etch the inter-layer dielectric layer without etching the stress layer to form a trench within the inter-metal dielectric layer, the etching stop layer and the inter-layer dielectric layer.

14. The method of fabricating an air gap of claim 13, further comprising after forming the trench, forming an insulating layer to seal the trench to form the air gap.

15. The method of fabricating an air gap of claim 9, wherein the second etching control value includes a second operational etching time and the second operational etching time is set such that the inter-layer dielectric layer is etched to form the second trench which does not etch completely through the inter-layer dielectric layer.

16. The method of fabricating an air gap of claim 9, wherein the first thickness information includes an average of thicknesses of the inter-metal dielectric layer at a center portion and at an edge portion of the substrate.

17. The method of fabricating an air gap of claim 9, wherein the second thickness information includes an average of thicknesses of the inter-layer dielectric layer at a center portion and at an edge portion of the substrate.

18. The method of fabricating an air gap of claim 1, wherein the first etching is performed based on a predetermined thickness of the inter-metal dielectric layer and a thickness of the inter-metal dielectric layer, the predetermined thickness is decided by measuring an average of thicknesses of the inter-metal dielectric layer at a center portion and at an edge portion on a blanket wafer, the blanket wafer is a wafer which is covered by the inter-metal dielectric layer and the etching stop layer without patterns thereon, the thickness is acknowledged by measuring the inter-metal dielectric layer on the substrate before the first etching.

* * * * *